United States Patent
Eskeldson et al.

(10) Patent No.: US 6,901,339 B2
(45) Date of Patent: May 31, 2005

(54) EYE DIAGRAM ANALYZER CORRECTLY SAMPLES LOW DV/DT VOLTAGES

(75) Inventors: David D. Eskeldson, Colorado Springs, CO (US); Richard A. Nygaard, Jr., Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 97 days.

(21) Appl. No.: 10/629,269

(22) Filed: Jul. 29, 2003

(65) Prior Publication Data

US 2005/0027467 A1 Feb. 3, 2005

(51) Int. Cl.[7] .............................................. G01R 19/00
(52) U.S. Cl. ....................................... 702/64; 331/1 A
(58) Field of Search ............................. 702/57, 58, 64, 702/66, 67, 69–73, 78, 79, 87; 324/76.11, 76.12, 76.13, 76.15, 76.16, 76.19, 76.22, 76.27, 76.39, 76.41, 76.47, 76.48; 375/119, 354, 355, 359, 360; 327/315, 121, 421, 144, 147, 150, 156, 157, 159, 236; 331/1 A, 10–12, 17, 19, 25, 34; 345/208, 418, 419, 440

(56) References Cited

U.S. PATENT DOCUMENTS

| | | | | |
|---|---|---|---|---|
| 4,001,716 A | * | 1/1977 | Swanson et al. | 331/48 |
| 4,074,178 A | * | 2/1978 | Bower | 318/631 |
| 5,075,640 A | * | 12/1991 | Miyazawa | 331/10 |
| 5,257,294 A | * | 10/1993 | Pinto et al. | 375/376 |
| 5,442,324 A | * | 8/1995 | Brauns | 331/34 |
| 5,684,760 A | * | 11/1997 | Hunter | 368/120 |
| 6,046,644 A | * | 4/2000 | Pitot et al. | 331/1 A |
| 6,359,519 B1 | * | 3/2002 | Farrow | 331/57 |

FOREIGN PATENT DOCUMENTS

| | | |
|---|---|---|
| EP | 0878763 A1 | 5/1998 |
| EP | 1143654 A3 | 4/2001 |

* cited by examiner

Primary Examiner—Carol S. Tsai
(74) Attorney, Agent, or Firm—Edward L. Miller

(57) ABSTRACT

A sampling transition-detector sets two latches to different values when an input signal comparator referenced to the selected voltage transitions during a sample interval: at the beginning one latch receives one comparison value while at the end the other latch receives an opposite comparison value. A difference (XOR) in latched values indicates a transition through the selected voltage during the sample interval. An additional latch is set by a second input signal comparator whose reference voltage is offset slightly from the selected voltage, It also clocked at the start of the sample interval. If the two latches clocked at the start of the sample interval are different, as indicated by another XOR, then the input was between the reference voltage and its offset counterpart. The OR of the two XORs is the desired indication.

6 Claims, 4 Drawing Sheets

SWEPT CLOCK CHANNEL DELAY

EYE DIAGRAM ANALYZER CORRECTLY SAMPLES LOW DV/DT VOLTAGES

REFERENCE TO RELATED APPLICATIONS

A recently developed technique for measuring digital signals to produce eye diagrams is described in a pending U.S. patent application entitled METHOD AND APPARATUS FOR PERFORMING EYE DIAGRAM MEASUREMENTS, Ser. No. 10/1020,673, filed on 29 Oct. 2001 by Richard A. Nygaard, Jr. and assigned to Agilent Technologies, Inc. The present Application is an improvement to a voltage sampling portion of that technique. For that reason, and to avoid having to repeat the majority of what is taught in that previously filed Application, METHOD AND APPARATUS FOR PERFORMING EYE DIAGRAM MEASUREMENTS is hereby expressly incorporated herein by reference. The improvement described herein is also of interest to a related alternate technique described in a pending U.S. patent application entitled EYE DIAGRAM ANALYZER WITH FIXED DATA CHANNEL DELAYS AND SWEPT CLOCK CHANNEL DELAY, Ser. No. 132,609, filed 25 Apr. 2002 by Richard A. Nygaard, Jr. and David D. Eskeldson and assigned to Agilent Technologies, Inc. For the same reasons EYE DIAGRAM ANALYZER WITH FIXED DATA CHANNEL DELAYS AND SWEPT CLOCK CHANNEL DELAY is also hereby expressly incorporated herein by reference.

PLAN OF THE APPLICATION

What follows now is, in large part, an abridged version of the Background of the "original" eye diagram analyzer technique and that is described in METHOD AND APPARATUS FOR PERFORMING EYE DIAGRAM MEASUREMENTS, combined with the Background from the "alternate" eye diagram analyzer technique that is described in EYE DIAGRAM ANALYZER WITH FDCED DATA CHANNEL DELAYS AND SWEPT CLOCK CHANNEL DELAY. The EYE DIAGRAM ANALYZER . . . Application of the alternate technique arose to offer a solution to a delay-dependent change in voltage calibration in the basic voltage measurement technique used by the original eye diagram analyzer technique, and that was called the "sick worm" problem. In short, it solved the problem by making the delay involved remain fixed, allowing voltage calibration to remain steady. However, both the original and the alternate eye diagram analyzer techniques use the same basic voltage measurement technique, which, it turns out, has its own potential (and as yet unmentioned) "low dv/dt problem" that we set out to fix with the present invention.

We begin by showing, and without too much comment, the central block diagrams from the original and alternate eye diagram analyzer techniques; they are prior art described by the incorporated Applications. Those original and alternate eye diagram analyzer techniques each use the same basic voltage measurement technique, and at that point it will then be appreciated that a single improved voltage measurement technique that is free of the "low dv/dt problem" could replace that basic voltage measurement technique in each of those eye diagram measurement techniques. After those background preliminaries, we will describe a preferred embodiment of an improved voltage measurement technique, more or less in isolation, with the understanding that it can be used in the original and alternate eye diagram analyzer techniques, as well as in other voltage measurement settings.

BACKGROUND OF THE INVENTION

Eye diagrams are a conventional format for representing parametric information about signals, and especially digital signals. Various prior art eye diagram testers are known, but we shall call the technique described in the two incorporated Applications, an Eye Diagram Analyzer, or EDA for short.

A modern eye diagram for a digital signal is not so much a trace formed continuously in the time domain, as it is an "eye" shape composed of closely spaced points (illuminated pixels) representing many individual measurement (time, voltage) samples taken upon separate instances of a signal occurring on a channel of interest, and which were then stored in a memory. Each measurement sample contributes to a displayed pixel. The eye shape appears continuous because the collection of pixels is rather dense, owing to the large number of times that the signal is sampled. Unlike a true continuous technique, however, there may be detached pixels that are separated from the main body of the eye shape.

In any event, the vertical axis is voltage, and the horizontal axis represents the differences in time (i.e.,various offsets) between some reference event and the locations for the measurement samples. The reference event is generally an edge of a clock signal in the system under test, represents directly or through some fixed delay the expected point in time when the value of an applied data signal would be captured by some receiving circuit in an SUT (System UnderTest), and is derived from an application of the SUT's clock to the Eye Diagram Analyzer. The time axis will generally have enough length to depict one complete eye-shape (cycle of a SUT signal) centered about the reference, with sometimes perhaps several additional eyes (cycles) before and after.

Different (X, Y) regions within a (sample) space containing an eye diagram represent different combinations of time and voltage. Assume that the eye diagram is composed of a number of pixels, and temporarily assume that the resolution is such that each different (X, Y) pixel position can represent a different combination of time and voltage (and vice versa), which combinations of time and voltage we shall term "measurement points." What the Eye Diagram Analyzer measures is the number of times, out of a counted number of clock cycles, that the signal on the channel being monitored passed through a selected measurement point. Then another measurement point is selected, and the process repeated until there are enough measurement points for all the pixels needed for the display. Points along the visible eye diagram trace describe something about those (time, voltage) combinations that were observed to actually occur in the data signal under test. The value of a (time, voltage) combination is represented by its location, but the color or intensity of the measured result is determined in a way that assists in further appreciating the meaning of the measured data, such as how often a (time, voltage) point was occupied by the signal being measured. The range over which the measurement points are varied is called a "sample space" and is defined during a measurement set-up operation. And in reality, we define the sample space and the resolution for neighboring measurement points first, start the measurement and then let the analyzer figure out later how to ascribe values to the pixels of the display. The "display" is, of course, an arbitrary graphic output device such as a printer or an X Window of some as yet unknown size in a window manager (e.g., X11) for a computer operating system. (A one-to-one correspondence between display pixels and measurement points is not required. It will be appreciated that it is conventional for display systems, such as X Windows, to figure out how to ascribe values to the pixels for an image when the correspondence between the display's pixel locations and the measurements that are the original image description is not one-to-one.)

The EDA of the incorporated "METHOD AND APPARATUS FOR PERFORMING EYE DIAGRAM MEASUREMENTS" operates by applying the clock signal from the SUT to a comparator circuit whose output is then delayed by a fixed amount, say about a half cycle, or some integral multiple thereof. The delayed clock comparison is then the reference mentioned above, and it used in determining when individually threshold-compared and then delayed data signals (the SUT data channels) are sampled.

This sampling of the individually threshold-compared and then delayed data signals is actually performed twice in rapid succession, a very brief (but selectable) amount of time apart. If these two successive samples (which are comparisons to the same voltage!) are different, then the input signal made a transition through the voltage of interest, and we call this a hit. This manner of sampling is what we termed the "basic voltage measurement technique" in the Plan Of The Application, and it accomplishes the taking of the (time, voltage) pairs that are the basic data of the eye diagram measurement, and it is an alternative to digitizing with a conventional Analog-to-Digital Converter (ADC). We use it because it works at frequencies that are impractical for ADCs, and because there are often a large number (greater than one hundred) of channels to measure. ADCs are large and expensive in comparison to this basic voltage measurement technique.

In the original METHOD AND APPARATUS . . . technique, different sampling voltages are obtained by varying the comparison thresholds for the data signals. Different times are obtained by varying the amount of delay in the data channel path, while leaving the clock data signal path essentially fixed. Skew between data channels is removed by introducing corresponding increases or decreases in the individual delays of the data channels.

An advantage of this technique is that, once skew is calibrated out, it allows the delay and threshold comparison for each data channel to vary independently as needed to complete the measurement. That is, the EDA will dwell on a measurement point for say, a specified number of clocks, or say, until some other condition is met, before moving on to the next measurement point. It sometimes happens that the rate of progress among the channels is not all the same. Hence, the ability to have independent variation by channel allows a faster partial accumulation of the results, which can be viewed by the operator as they are obtained.

There is, however, a disadvantage to this eye diagram analyzer technique as set out in "METHOD AND APPARATUS FOR PERFORMING EYE DIAGRAM MEASUREMENTS". The delay lines used are each a tapped series of non-inverting buffers. The input is applied to the start of the tapped series, and the delayed output is taken at the location in the series selected by the tap. It is important to remember that each buffer in the tapped sequence has a frequency response (finite rise and fall times), and that the combined effect for large values of delay (over a thousand buffers in series) is significant. The effective rise and fall time for the stage of delay at the final tap is considerably less than that for any single buffer in the sequence, and it can turn an Eye Diagram Analyzer into a Worm Diagram Generator as voltage comparison outputs propagating through the delay lines appear to become pulses that are either too short or too long, and then fail to properly activate the difference detection mechanism. (For brevity, we can't here do justice to the whole, and somewhat subtle, chain of cause and effect. Fortunately, we don't need to. Curious readers should consult the incorporated EYE DIAGRAM ANALYZER WITH FIXED DATA CHANNEL DELAYS AND SWEPT CLOCK CHANNEL DELAY). In any event, a cure for this is set out in that incorporated Application, even though it still continues to use the same basic voltage measurement technique.

FIG. 1 is a simplified block diagram 11 of the original (swept data channel delay) EDA technique. FIG. 2 is a simplified block diagram 12 of the alternate (swept clock channel delay) EDA technique. Observe that they both use the same mechanism to sample data channel voltage, which is the afore-mentioned technique of noticing that the output of a comparator has changed.

In particular, note that in FIG. 1 a variable SWEPT DATA SIGNAL DELAY 10 produces a voltage-compared data channel signal 2 that has been delayed by a variable amount according to what amount of delay in a cycle of swept amounts of delay is currently in effect. The signal 2 is applied to a D input of a latch 3 that is clocked by a clock signal 1, that while it has been delayed by a CONFIGURABLE CLOCK TRIM DELAY mechanism 9, may be thought of as being "the SUT clock". The voltage-compared data channel signal 2 is also applied to the D input of another latch 4 that is clocked by a slightly delayed (by dt DELAY) version of the clock signal 1. The idea is that if the SUT data signal for that channel passed through the comparison threshold at a time corresponding to the current SWEPT DATA SIGNAL DELAY, then the two latches 3 and 4 will capture different values, which condition is detected by XOR gate 6 and used to increment a # OF HITS COUNTER 7. We call this mechanism a TRANSITION DETECTOR (8) or a QUANTIZED dv/dt DETECTOR.

In FIG. 2 there is a block diagram 12 of the swept clock channel delay technique, which, it will be appreciated from the figure, has the same TRANSITION DETECTOR (8) or a QUANTIZED dv/dt DETECTOR. In fact, the block diagrams 11 and 12 are seemingly identical, although they operate in different manners. What used to be a CLOCK TRIM DELAY 9 in FIG. 1 is now operated as SWEPT CLOCK DELAY 13 in FIG. 2, and what used to be SWEPT DATA SIGNAL DELAY 10 in FIG. 1 is now operated as DATA SIGNAL DE_SKEW DELAY 14.

It would be desirable for use in either EDA architecture if the voltage measurement mechanism were capable of detecting that a signal to be sampled was or was not, to within some agreeable tolerance, at a certain voltage, and to do so without relying solely on a transition through that certain voltage, so that a signal of the certain voltage will produce a hit even if is not in transition at the time of sampling. Why this would be a desirable improvement is explained as follows.

With both of the techniques of FIGS. 1 and 2 the reliance on detecting a transition through a certain threshold to decide upon a signal value at the time of sampling remains open to failure to detect a hit when the signal voltage does not aggressively transition at the time of the sample. The basic voltage sampling mechanism relies somewhat on noise in the signal and uncertainty in the comparator to cause hits along the top (exerted / not exerted) and baseline (not exerted I exerted) signal values. A perfectly clean noise-free signal having no dv/dt between its rise and fall, combined with an ideal comparator, would produce no hits except during the rise and fall. So we have a situation where, if the SUT's signals are really quite good and the measurement hardware is also really quite good, then the eye diagram goes away except at the transitions; it would seem that better is worse! So far, nobody's equipment is quite that good, but the notion of "better is worse" is a disgusting situation that needs to be foreclosed. What to do?

SUMMARY OF THE INVENTION

A sampling transition-through-a-selected-voltage-detector sets two latches to different values when an input signal comparator referenced to the selected voltage transitions during a sample interval: at the beginning of the sample interval one latch receives one comparison value while at the end of the sample interval the other latch receives an opposite comparison value. A difference (XOR) in latched values for the transition detection latches indicates a transition through the selected voltage during the sample interval. A solution to the problem of such a transition-through-a-selected-voltage detection mechanism's insensitivity to steady state voltages may be solved by including an additional latch that is set by a second input signal comparator whose reference voltage is offset slightly from that used to detect transitions through the selected voltage, and that is also clocked at the start of the sample interval. Thus there are two latches clocked at the start of the sample interval. If they are different, as indicated by another XOR, then the input was between the reference voltage and its slightly offset counterpart, even if the input signal was not in transition, or was steady state, at the start of the sample interval. The OR of the two XORs is the desired sampled indication of the value of the input signal for the sample interval, and is latched into an output latch, either at the start of the sample interval (for a pipelined system where the output is one state behind the samples) or is latched after delay no greater than the length of the sample interval (for a non-pipelined system).

DESCRIPTION OF A PREFERRED EMBODIMENT

Figure 3:
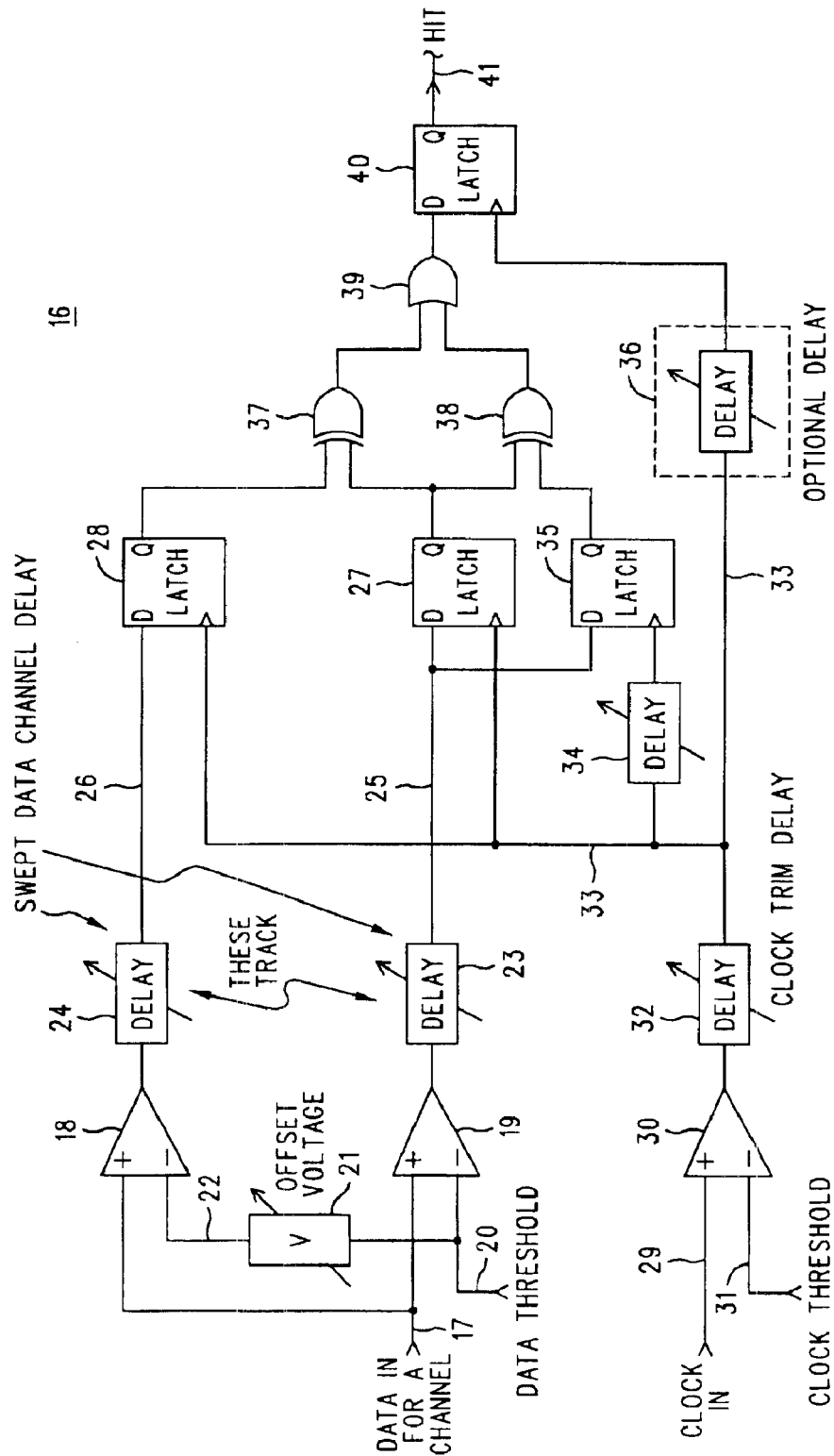
FIG. 3 is a simplified block diagram of an improved hit detection mechanism for an eye diagram analyzer using swept data channel delay.

Refer now to FIG. 3, wherein is shown a simplified block diagram 16 of an improved hit detection mechanism for an Eye Diagram Analyzer. In FIG. 3 the architecture shown is for swept data channel delay.

A conditioned SUT data channel signal 17 is applied to a COMPARATOR 19 that also receives a DATA THRESHOLD voltage 20. The logical output signal from the COMPARATOR 19 is applied through an adjustable DELAY 23 (the SWEPT part of this architecture arises from varying the adjustable delay) to the D inputs of LATCHES 27 and 35. (It will be appreciated that the various adjustable delay elements shown are, as set out in the incorporated Applications, tapped sequences of buffers in series.)

A conditioned SUT CLOCK IN signal 29 is applied to another COMPARATOR 30 that receives a CLOCK THRESHOLD voltage 31. The logical output of the COMPARATOR 30 is applied through a CLOCK TRIM DELAY 32 (that is typically set and then left alone) as a clocking signal 33 to the LATCH 27, and via an additional DELAY 34 to LATCH 35. DELAY 34 corresponds to the dt DELAY 5 of FIGS. 1 and 2, and the two LATCHES 27 and 35 of FIG. 3 to LATCHES 3 and 4, respectively (for either of FIGS. 1 and 2). XOR gate 38 of FIG. 3 serves the same purpose as XOR gate 6 of FIGS. 1 and 2, and to this point we have described much of the same basic structure as the TRANSITION DETECTOR 8 of FIGS. 1 and 2. That is, if the DATA IN signal 17 experiences at transition through the threshold 20 during a period of time occupied by DELAY 34, as located by DELAY 23, then the two latches 27 and 35 will have different values, and the exerted output from XOR gate 38 will pass through OR gate 39 to set LATCH 40 and produce a signal HIT 41 that is then used by the balance of the Eye Diagram Analyzer in ways that are set out in the incorporated Applications.

Now note that the DATA IN signal 17 is also applied to a second COMPARATOR 18 whose threshold 22 is different from the DATA THRESHOLD 20 by an amount set by an OFFSET VOLTAGE 21. The logical output from COMPARATOR 18 is applied through DELAY 24 (which preferably tracks DELAY 23, save that it may be offset to compensate channel-to-channel skew) as signal 26 to the D input of LATCH 28 that is clocked by signal 33. A moment's consideration will confirm that if the DATA IN signal 17 is, at the time located by the DELAY 32 (i.e., clocked by signal 33), of a value that is within the (signed) OFFSET VOLTAGE 21 from the DATA THRESHOLD 20, then the two LATCHES 28 and 27 will have different values after being clocked by signal 33. As a particular example when the OFFSET value 21 is positive, LATCH 27 will be set, and LATCH 28 will not be set. The underlying implication that may be drawn is that the level (voltage value at the time of sampling) of the SUT data signal of interest is close (within the OFFSET value 21) to the value of the DATA THRESHOLD 20. On the other hand, if the SUT data signal level is safely on one side of the DATA THRESHOLD 20 by an amount exceeding the OFFSET 21, then both LATCHES 27 and 28 will be set, while in the other case (voltage level on the "other side" neither LATCH will be set. In either case, they (27, 28) are both the same after being clocked by signal 33. However, as noted, in the case of interest (which is a HIT), the LATCHES will be different, and XOR gate 37 will detect such and OR gate 39 will merge this HIT indication with the output of XOR gate 38. The merged result is applied to LATCH 40, from whence things proceed as usual, save that we are now able to detect HITS that may have eluded the TRANSITION DETECTOR 8 of FIGS. 1 and 2.

Now, the minimum size of OFFSET VOLTAGE 21 is generally small, although it should be larger than the equivalent noise level of the system without the extra COMPARATOR 18 and LATCH 28. As a maximum limit, it may be set to be comparable to the Y axis voltage resolution specified by the operator. Say, for example, in the range of one to one hundred millivolts. However, it is best to pick the size of the OFFSET VOLTAGE 21 to be somewhat greater than the specified voltage resolution (say, 105% or 110%), to prevent the possibility of noise and comparator uncertainty conspiring to produce "dead bands" of low dv/dt induced insensitivity (the very problem we are wanting to solve . . . ) from existing between adjacent settings of the DATA THRESHOLD value 20.

Lastly, note optional DELAY 36. If there were no such DELAY 36 then the LATCH 40 captures the results for a cycle of CLOCK IN 31 that is one cycle advanced ahead of the present cycle. In a pipelined system this is not a major shortcoming, as things are later aligned by pipeline delays, anyway. If the delay is present, and chosen to be more than DELAY 34 and less than a clock cycle, then "newest" results are clocked into LATCH 41.

Figure 1:
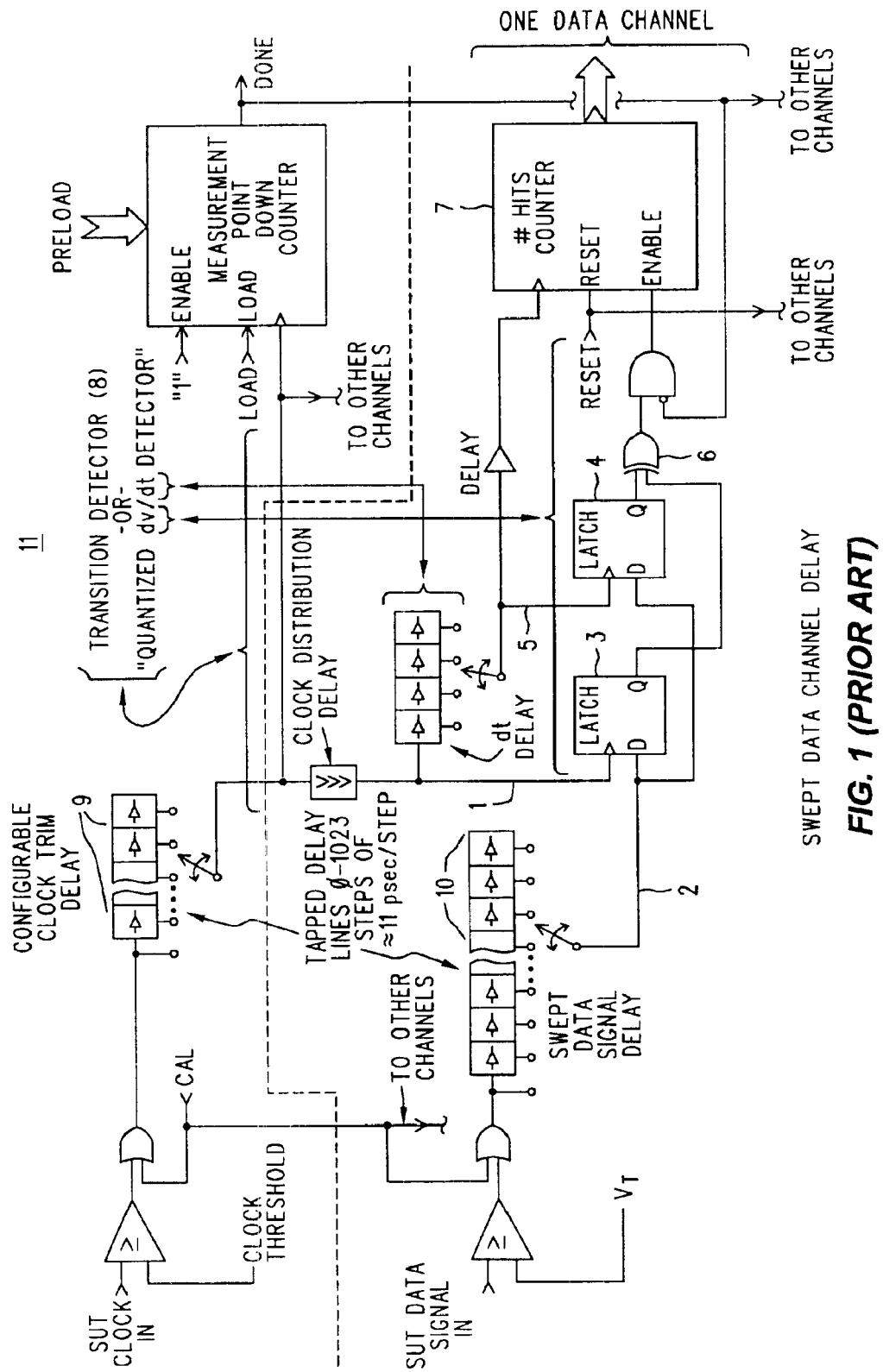
FIG. 1 is a simplified block diagram of a prior art eye diagram analyzer that uses swept data channel delay.
Figure 2:
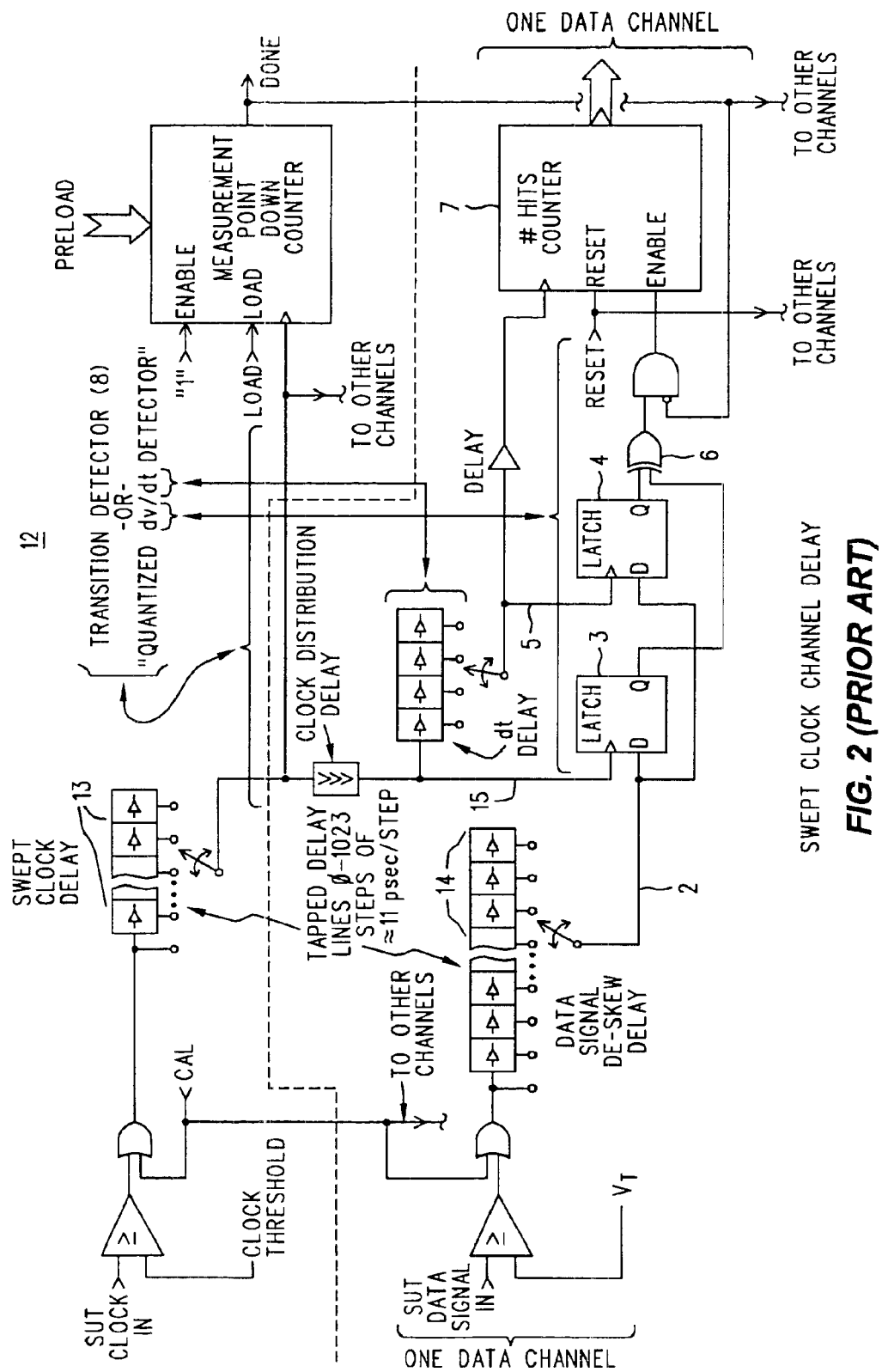
FIG. 2 is a simplified block diagram of a prior art eye diagram analyzer that uses swept clock channel delay.
Figure 4:
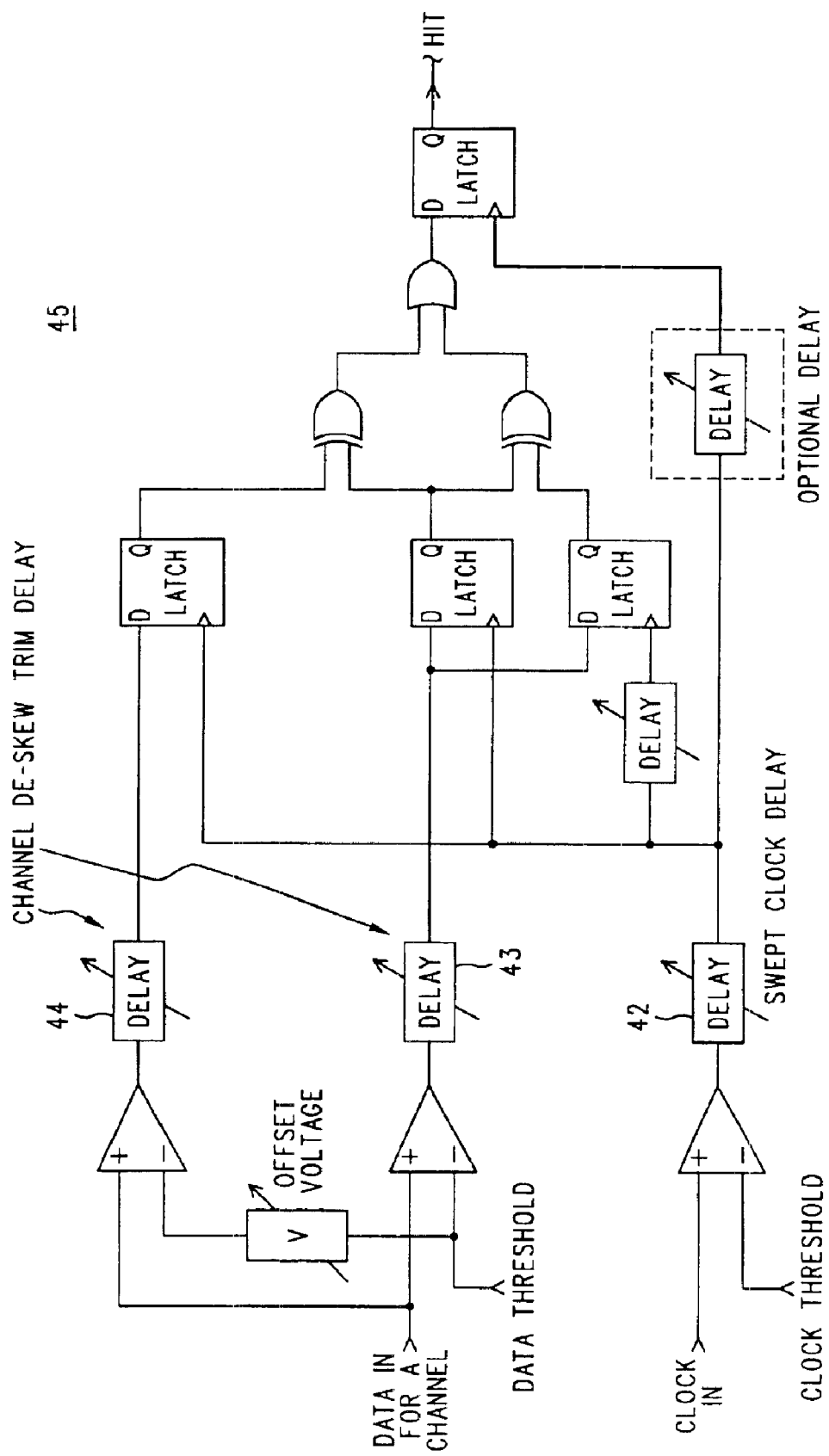
FIG. 4 is a simplified block diagram of an improved hit detection mechanism for an eye diagram analyzer using swept clock delay.

A brief reference to FIG. 4 will reveal a simplified block diagram 45 that is as similar to the block diagram 16 of FIG 3 as FIG. 2 is similar to FIG. 1. The operation of the circuit is essentially the same as described for FIG. 3, save that the DELAYs 43 and 44 produce a TRIM DELAY that de-skews the data channels, and DELAY 42 operates as a SWEPT CLOCK DELAY.

We claim:

1. A method of measuring the level of a recurring data signal at selected times relative to a recurring reference associated with the data signal, the method comprising the steps of:
   (a) comparing the instantaneous voltage of a clock signal associated with the data signal to a clock threshold voltage to produce a logical clock signal;
   (b) delaying the logical clock signal by a selected first amount to produce a delayed logical clock signal;
   (c) comparing the instantaneous voltage of the data signal to be measured to a first data threshold voltage to produce a first logical data signal;
   (d) delaying the first logical data signal by a selected second amount to produce a first delayed logical data signal;
   (e) delaying the delayed logical clock signal by a selected third amount to produce a doubly delayed logical clock signal;
   (f) capturing the value of the first delayed logical data signal in response to the delayed logical clock signal;
   (g) capturing the value of the first delayed logical data signal in response to the doubly delayed logical clock signal;
   (h) generating the XOR of the value captured in step (f) and the value captured in step (g);
   (i) comparing the instantaneous voltage of the data signal to be measured to a second data threshold voltage to produce a second logical data signal;
   (j) delaying the second logical data signal by the selected second amount to produce a second delayed logical data signal;
   (k) capturing the value of the second delayed logical data signal in response to the delayed logical clock signal;
   (l) generating the XOR of the value captured in step (f) and the value captured in step (k);
   (m) generating the OR of the XOR values generated in steps (h) and (l); and
   (n) capturing the logical value of the OR operation generated in step (m).

2. A method as in claim 1 further comprising the steps of:
   (o) repeating steps (a) through (n) until a selected condition is satisfied;
   (p) subsequent to step (o), storing, in a data structure indexed according to a difference between the first and second amounts and also indexed according to one of the first and second data threshold voltages, a count representing the number of times the captured value of step (n) is TRUE during the repeating of steps (a) through (n);
   (q) repeating steps (a) through (p) with identically altered values for the first and second data threshold voltages in combination with altered values for the second amount; and
   (r) generating an eye diagram from the counts stored in the data structure.

3. A method of measuring the level of a recurring data signal at selected times relative to a recurring reference associated with the data signal, the method comprising the steps of:
   (a) comparing the instantaneous voltage of a clock signal associated with the data signal to a clock threshold voltage to produce a logical clock signal;
   (b) delaying the logical clock signal by a selected first amount to produce a delayed logical clock signal;
   (c) comparing the instantaneous voltage of the data signal to be measured to a first data threshold voltage to produce a first logical data signal;
   (d) delaying the first logical data signal by a selected second amount to produce a first delayed logical data signal;
   (e) delaying the delayed logical clock signal by a selected third amount to produce a doubly delayed logical clock signal;
   (f) capturing the value of the first delayed logical data signal in response to the delayed logical clock signal;
   (g) capturing the value of the first delayed logical data signal in response to the doubly delayed logical clock signal;
   (h) generating the XOR of the value captured in step (f) and the value captured in step (g); (i) comparing the instantaneous voltage of the data signal to be measured to a second data threshold voltage to produce a second logical data signal;
   (j) delaying the second logical data signal by a selected fourth amount to produce a second delayed logical data signal;
   (k) capturing the value of the first delayed logical data signal in response to the delayed logical clock signal;
   (l) generating the XOR of the value captured in step (f) and the value captured in step (k);
   (m) generating the OR of the XOR values generated in steps (h) and (l); and
   (n) capturing the logical value of the OR operation generated in step (m).

4. A method as in claim 3 further comprising the steps of:
   (o) repeating steps (a) through (n) until a selected condition is satisfied;
   (p) subsequent to step (o), storing, in a data structure indexed according to a difference between the first and second amounts and also indexed according to one of the data first and second threshold voltages, a count representing the number of times the captured value of step (n) is TRUE during the repeating of steps (a) through (n);
   (q) repeating steps (a) through (p) with identically altered values for the first and second data threshold voltages in combination with altered values for the first amount; and
   (r) generating an eye diagram from the counts stored in the data structure.

5. An eye diagram analyzer comprising:
   a variable clock signal waveform delay circuit having an input for receiving a clock signal and an output producing a delayed clock signal;
   a first threshold detector having a variable first threshold, an input for receiving a data signal to be measured as an eye diagram and having an output producing a first logical data signal;
   a first variable data signal waveform delay circuit having an input coupled to receive the first logical data signal and an output producing a first delayed logical data signal;
   a second threshold detector having a variable second threshold, an input for receiving the data signal to be measured as an eye diagram and having an output producing a second logical data signal;

a second variable data signal waveform delay circuit having an input coupled to receive the second logical data signal and an output producing a second delayed logical data signal;

the first delayed logical data signal and the second logical data signal being delayed by the same amounts;

a transition detection circuit coupled to the delayed clock signal and to the first delayed logical data signal, and having an output producing a transition signal indicative of a transition in the first delayed logical data signal occurring during a selected length of time subsequent to a transition in the delayed clock signal;

a voltage range detection circuit coupled to the delayed clock signal, to the first delayed logical data signal and to the second delayed logical data signal, and having an output producing an in-range detection signal indicative that voltage of the data signal is within a voltage range determined by the first and second thresholds;

a counter coupled to the logical OR of the transition signal with the in-range detection signal, and that counts occurrences thereof; and a memory whose content is organized as a data structure indexed by the difference in delays for the variable clock signal waveform delay circuit and the variable data signal waveform delay circuit, by at least one of the variable first and second thresholds, and that stores in an indexed location the number of counted occurrences.

6. An eye diagram analyzer comprising:

a variable clock signal waveform delay circuit having an input for receiving a clock signal and an output producing a delayed clock signal;

a first threshold detector having a variable first threshold, an input for receiving a data signal to be measured as an eye diagram and having an output producing a first logical data signal;

a first variable data signal waveform delay circuit having an input coupled to receive the first logical data signal and an output producing a first delayed logical data signal;

a second threshold detector having a variable second threshold, an input for receiving the data signal to be measured as an eye diagram and having an output producing a second logical data signal;

a second variable data signal waveform delay circuit having an input coupled to receive the second logical data signal and an output producing a second delayed logical data signal;

the first delayed logical data signal and the second logical data signal being delayed by selected amounts that de-skew them;

a transition detection circuit coupled to the delayed clock signal and to the first delayed logical data signal, and having an output producing a transition signal indicative of a transition in the first delayed logical data signal occurring during a selected length of time subsequent to a transition in the delayed clock signal;

a voltage range detection circuit coupled to the delayed clock signal, to the first delayed logical data signal and to the second delayed logical data signal, and having an output producing an in-range detection signal indicative that voltage of the data signal is within a voltage range determined by the first and second thresholds;

a counter coupled to the logical OR of the transition signal with the in-range detection signal, and that counts occurrences thereof; and a memory whose content is organized as a data structure indexed by the difference in delays for the variable clock signal waveform delay circuit and the variable data signal waveform delay circuit, by the at least one of the variable first and second thresholds, and that stores in an indexed location the number of counted occurrences.

* * * * *